(12) United States Patent
Michal (10) Patent No.: US 12,352,621 B2
(45) Date of Patent: Jul. 8, 2025

(54) AMBIENT LIGHT SENSOR

(71) Applicant: STMicroelectronics (Alps) SAS, Grenoble (FR)

(72) Inventor: Vratislav Michal, Fontanil-Cornillon (FR)

(73) Assignee: STMicroelectronics (Alps) SAS, Grenoble (FR)

( * ) Notice: Subject to any disclaimer, the term of this patent is extended or adjusted under 35 U.S.C. 154(b) by 174 days.

(21) Appl. No.: 17/955,056

(22) Filed: Sep. 28, 2022

(65) Prior Publication Data

US 2024/0110826 A1 Apr. 4, 2024

(51) Int. Cl.
*G01J 1/42* (2006.01)
*G01J 1/44* (2006.01)
*H03F 3/45* (2006.01)

(52) U.S. Cl.
CPC ............... *G01J 1/4204* (2013.01); *G01J 1/44* (2013.01); *G01J 2001/446* (2013.01); *H03F 3/45071* (2013.01); *H03F 2200/375* (2013.01)

(58) Field of Classification Search
CPC ...... G01J 1/4204; G01J 1/44; G01J 2001/446; G01J 1/46; H03F 3/45071; H03F 2200/375; H03F 3/087; H03F 3/387; H03F 3/45968; H03F 2203/45512; H03F 2203/45514; H03F 3/45475
See application file for complete search history.

(56) References Cited

U.S. PATENT DOCUMENTS

| 4,633,425 A | * | 12/1986 | Senderowicz | ...... H03F 3/45479 341/172 |
| 2010/0253368 A1 | * | 10/2010 | Cheng | ................ G01R 27/2605 324/658 |
| 2022/0299362 A1 | * | 9/2022 | Adusumalli | ........ H03F 3/45475 |
| 2022/0357374 A1 | * | 11/2022 | Gan | ................... G01R 19/0038 |

FOREIGN PATENT DOCUMENTS

| CN | 105282460 B | 8/2018 |
| EP | 2851661 A1 | 3/2015 |
| WO | 2020178455 A1 | 9/2020 |

OTHER PUBLICATIONS

Domingues, Suzana, et al., "A CMOS THz Staring Imager with In-pixel Electronics", 2011 7th Conference on Ph.D. Research in Microelectronics and Electronics, Madonna di Campiglio, Italy, Jul. 3-7, 2011, pp. 81-84.

Inpi, Search report from French Patent Application No. 2108026, Apr. 19, 2022, 14 total pages.

* cited by examiner

*Primary Examiner* — Georgia Y Epps
*Assistant Examiner* — Monica T Taba
(74) *Attorney, Agent, or Firm* — Slater Matsil, LLP (57) ABSTRACT

A circuit can be used for reading out a light sensor. The circuit includes an operational amplifier. A first capacitor has a first electrode coupled to an inverting input of the operational amplifier and a second electrode coupled to a non-inverting output of the operational amplifier. A compensation circuit is coupled between the operational amplifier and the first capacitor. A preset circuit has an input coupled to a first voltage node and an output coupled to the first capacitor. The first voltage node configured to carry a first voltage equal to a preset voltage multiplied by a coefficient.

19 Claims, 6 Drawing Sheets

AMBIENT LIGHT SENSOR

CROSS-REFERENCE TO RELATED APPLICATIONS

This application is related to French Patent Application No. 2108026, filed on Jul. 23, 2021, which application is hereby incorporated herein by reference.

TECHNICAL FIELD

The subject matter of the disclosure relates to an ambient light sensor.

BACKGROUND

An ambient light sensor, or ambient luminosity sensor, is an electronic device or an electronic component used to measure the luminosity or the luminosity variations of an ambient light source at a given wavelength. An ambient light sensor may be implemented, for example, by a phototransistor, a photodiode, and/or by a photonic integrated circuit.

An ambient light sensor generally forms part of a more complete measurement device, where it may be accompanied by one or a plurality of circuits, such as a readout circuit, a calibration circuit, etc.

An ambient light measurement device may be used in a display electronic circuit to adapt the luminosity of the display according to the ambient lighting, or to adapt the color scheme of the display.

SUMMARY

Embodiments of the invention can at least partly improve known ambient light sensors and known circuits accompanying ambient light sensors.

The present disclosure generally concerns electronic devices and systems and, more specifically, measurement devices. The present disclosure more particularly relates to an ambient light measurement device. Such a device is generally formed of one or a plurality of ambient light sensors and of circuits accompanying them, such as readout circuits, or calibration circuits. In particular embodiments, the disclosure concerns a circuit for reading out an ambient light sensor.

Embodiments can provide higher-performance ambient light measurement devices.

Embodiments can provide higher-performance circuits accompanying ambient light sensor in a measurement device.

Embodiments can provide higher-performance ambient light sensor readout circuits.

Embodiments can provide more accurate ambient light sensor readout circuits.

Embodiments can overcome all or part of the disadvantages of known ambient light sensor readout circuits.

Embodiments can provide an ambient light sensor readout circuit enabled to compensate for the parasitic impedance of the ambient light sensor.

An embodiment provides a circuit for reading out a light sensor comprising an integrator assembly comprising an operational amplifier, a first capacitor, and a circuit adapted to compensating for an offset voltage of the operational amplifier. A first electrode of the first capacitor is coupled to an inverting input of the operational amplifier and a second electrode of the first capacitor is coupled to a non-inverting output of the operational amplifier. A preset circuit is adapted to receive a first voltage equal to a preset voltage multiplied by a coefficient and to charge the first capacitor.

According to an embodiment, the circuit adapted to compensating for an offset voltage of the operational amplifier comprises an input circuit coupled to the inverting input and to a non-inverting input of the operational amplifier an output circuit coupled to inverting and non-inverting outputs of the operational amplifier.

According to an embodiment, the circuit adapted to compensating for an offset voltage of the operational amplifier is adapted to delivering a square pulse signal having an amplitude equal to the amplitude of the offset voltage of the operational amplifier.

According to an embodiment, the preset circuit comprises a second capacitor having a capacitance equal to the capacitance of the first capacitor divided by the coefficient, a third capacitor having a capacitance smaller than the capacitance of the first capacitor, and a fourth capacitor having a capacitance equal to the capacitance of the third capacitor divided by the coefficient.

According to an embodiment, the second and fourth capacitors are coupled in parallel.

According to an embodiment, a third electrode of the second capacitor is coupled to a node receiving the first voltage by a first switch and is coupled to a node receiving a reference potential by a second switch, and a fourth electrode of the second capacitor is coupled to the inverting input of the operational amplifier by a third switch and is coupled to the node receiving a reference potential by a fourth switch.

According to an embodiment, the third capacitor is short-circuited by a fifth switch and is coupled to the inverting input of the operational amplifier by a sixth switch.

According to an embodiment, the coefficient is greater than zero.

According to an embodiment, the operational amplifier operates in a saturation mode.

According to an embodiment, the preset circuit comprises a first resistor having a first terminal coupled to the node receiving the first voltage, and a second terminal coupled to an input of a flip-flop which oscillates between the node receiving the reference potential and the non-inverting input of the operational amplifier. A second resistor has a third terminal coupled to the non-inverting input of the operational amplifier and a fourth terminal coupled to the non-inverting output of the operational amplifier via a seventh switch.

According to an embodiment, the coefficient is equal to −1.

Another embodiment provides an ambient light measurement device comprising an ambient light sensor and a readout circuit described previously.

According to an embodiment, the sensor is a photodiode.

Another embodiment provides a method of use of the device described previously, comprising ta phase of precharge of the first capacitor and an integration phase.

According to an embodiment, the method comprises a reset phase where the first capacitor is discharged.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION OF ILLUSTRATIVE EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1A:
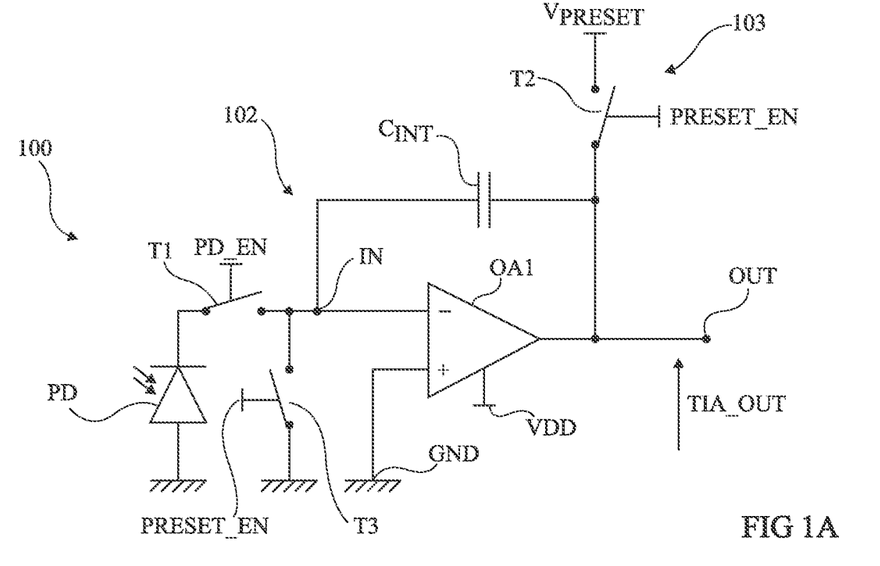
FIGS. 1A and 1B show two equivalent electric diagrams of an ambient light measurement device.
Figure 1B:
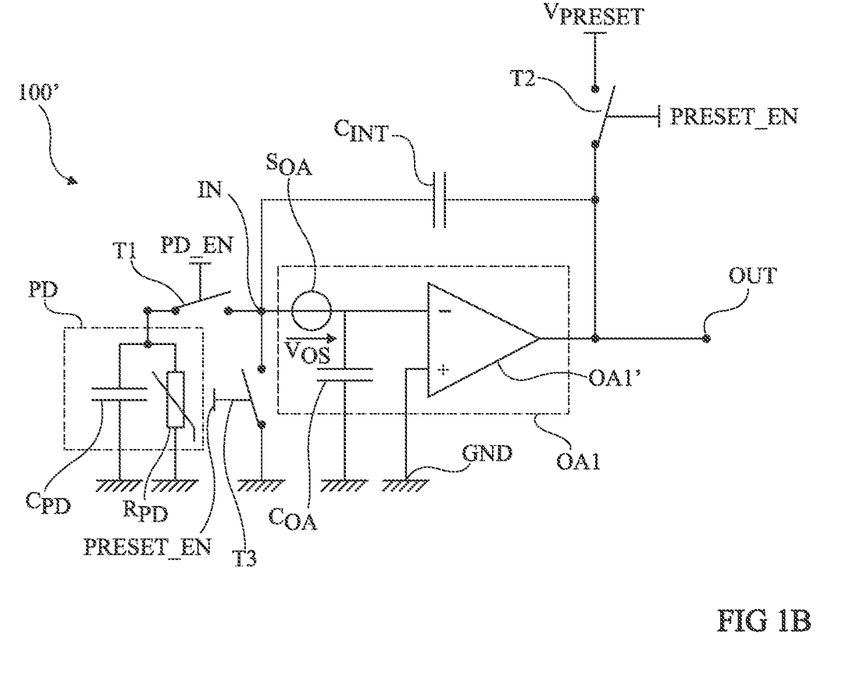

FIGS. 1A and 1B show two equivalent electric diagrams of an ambient light measurement device 100. More particularly, electric diagram in FIG. 1A shows the architecture of device 100 and the electric diagram of FIG. 1B shows an equivalent architecture 100' of device 100 where some of the components of device 100 are replaced with one of their equivalent circuit models.

Device 100 is formed of an ambient light sensor PD, of a readout circuit 102.

According to an embodiment, the ambient light sensor is a photodiode PD. The anode of photodiode PD is coupled, preferably connected, to a node GND receiving a reference potential, for example, the ground. The cathode of photodiode PD is coupled to an input node IN of readout circuit 102 via a switch T1 controlled by a signal PD_EN.

Readout circuit 102 comprises an integrator circuit and a preset circuit. The integrator circuit comprises, between input node IN and output node OUT, an operational amplifier OA1 and a capacitor $C_{INT}$ having a variable capacity.

Operational amplifier OA1 comprises an inverting input (−) coupled, preferably connected, to input IN of the readout circuit, and a non-inverting input (+) coupled, preferably connected, to node GND. Operational amplifier OA1 comprises a non-inverting output coupled, preferably connected, to output node OUT, and delivers on this output node a voltage TIA-OUT taken as a reference to the reference voltage of node GND. Operational amplifier OA1 is further supplied with a DC power supply voltage VDD.

Capacitor $C_{INT}$ comprises a first electrode coupled, preferably connected, to input node IN, and a second electrode coupled, preferably connected, to output node OUT. Capacitor $C_{INT}$ can have a very low capacitance, for example, in the range from 20 fF to 10 pF, for example, in the order of 50 fF. According to another embodiment, the capacity of capacitor $C_N$ can range up to a picofarad, for example, can be in the range from 1 to 10 pF.

The preset circuit of readout circuit 102 comprises two switches T2 and T3 controlled by a same signal PRESET_EN. Switch T2 has one of its terminals coupled, preferably connected, to node OUT, and its other terminal coupled, preferably connected, to a node receiving a preset voltage $V_{PRESET}$, referenced to the reference potential of node GND. Switch T3 has one of its terminals coupled, preferably connected, to node IN, and its other terminal coupled, preferably connected, to node GND.

Device 100 operates by alternation of two phases: a phase of preset of capacitive element $C_{INT}$, and a charge of integration of the voltage delivered by photodiode PD. During the preset phase, switch T2 is conductive and preset voltage $V_{PRESET}$ charges capacitor $C_{INT}$. During the preset phase, switch T1 does not conduct, and the photodiode is disconnected from the readout circuit. At the end of the preset phase, output voltage OUT is equal to preset voltage $V_{PRESET}$, and the value output voltage OUT is stored in capacitor $C_{INT}$.

During the integration phase, switch S101 is conductive, and photodiode PD delivers a current dependent of the luminosity or of the luminosity variations of an ambient light source to readout circuit 102. The preset circuit is disconnected by the turning off of switches T2 and T3.

A disadvantage of device 100 is that the ambient light sensor, that is, photodiode PD, may have a parasitic impedance, and operational amplifier OA1 may have an offset voltage as an input, which both may impact the output voltage TIA_OUT. Architecture 100' takes into account and models these two parasitic phenomena.

In architecture 100', photodiode PD (designated by dotted lines) is represented by its non-linear model comprising a non-linear and temperature dependent resistor $R_{PD}$ arranged in parallel with a capacitor $C_{PD}$. More particularly, a terminal of resistor $R_{PD}$ and an electrode of capacitor $C_{PD}$ are coupled, preferably connected, to input node IN, and the other terminal of resistor $R_{PD}$ and the other electrode of capacitor $C_{PD}$ are coupled, preferably connected, to node GND.

Figure 2:
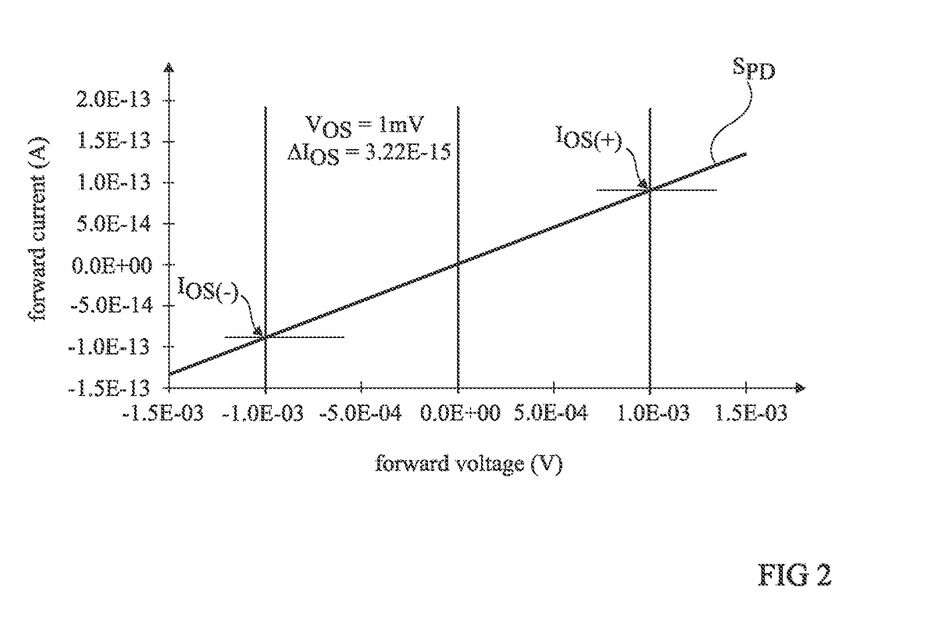
FIG. 2 shows a graphic illustrating the operation of a photodiode.

Resistivity of resistor $R_{PD}$ depends of the variation of the current-voltage characteristic, or I-V characteristic, of the photodiode PD, which one part is illustrated by FIG. 2. Moreover, the impact of the resistor $R_{PD}$ is relatively weak at low temperature, but may be important at high temperature.

More particularly, FIG. 2 represents a curve $S_{PD}$ illustrating the characteristic current-voltage of the photodiode PD wherein the voltage is on the range from a work voltage and its opposite, noted, respectively, voltage $-V_{OS}$ and $V_{OS}$, and are described in more detail hereafter. Voltage $V_{OS}$ is a voltage very small and close to zero, for example on the range of 1 mV. In theory, the characteristic of the photodiode has a similar shape as a curve obtained with the Shockley equation, but in practical, and in the range considered, the characteristic has a linear progression. Thus, around the zero voltage and the work voltage, the output current of the photodiode depends linearly of the input voltage and of the resistivity of the resistance $R_{PD}$.

Further, in architecture 100', operational amplifier OA1 (designated with dotted lines) is represented by an ideal operational amplifier OA1' accompanied by a capacitor $CO_A$ and a voltage source $S_{OA}$. Voltage source $S_{OA}$ delivers a voltage $V_{OS}$ equal to the offset voltage at the input offset voltage of operational amplifier OA1, voltage $V_{OS}$ being the work voltage described before. Voltage source $S_{OA}$ is arranged in series between input node IN and the inverting input (−) of operational amplifier OA1'. Capacitor $C_{OA}$ has a first electrode coupled, preferably connected, to the inverting input of operational amplifier OA1', and a second electrode coupled, preferably connected, to node GND. Ideal operational amplifier OA1' has its non-inverting input (+) coupled, preferably connected, to node GND, and its output coupled, preferably connected, to node OUT.

When the precharge phase is over, the output voltage is actually not perfectly equal to voltage $V_{PRESET}$, but is given by the following formula:

$$\text{TIA\_OUT} = V_{PRESET} - V_{OS} \frac{C_{PD} + C_{OA}}{C_{INT}}$$

The embodiments disclosed hereafter aim at compensating as much as possible for the error voltage introduced by these parasitic phenomena.

Figure 3:
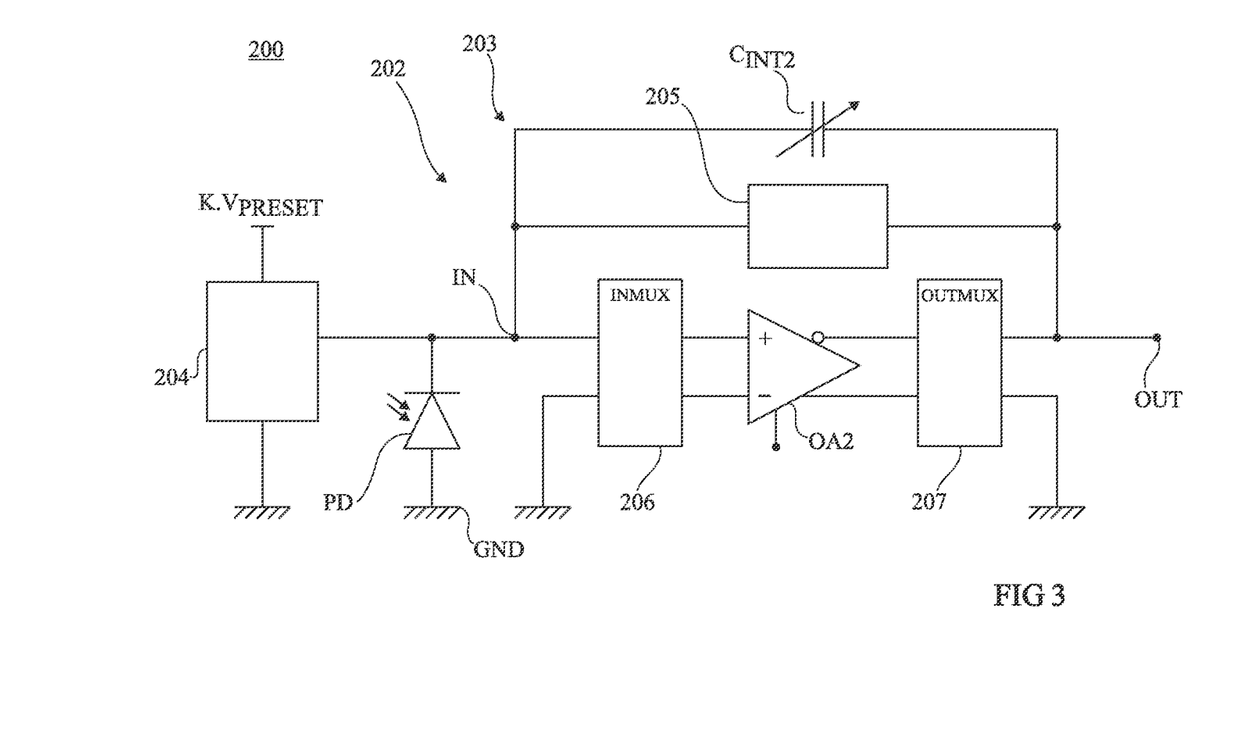
FIG. 3 schematically and partially shows in the form of blocks an embodiment of an ambient light measurement device.

FIG. 3 is an electric diagram of an ambient light measurement device 200 according to an embodiment.

Like the device 100 described in relation with FIG. 1, device 200 is formed of an ambient light sensor PD, of a readout circuit 202 delivering a voltage TIA_OUT on its output node OUT representative of a variation of the ambient light measured by sensor PD.

As in FIG. 1, the ambient light sensor is a photodiode PD. The anode of photodiode PD is coupled, preferably connected, to a node GND receiving a reference potential, for example, the ground. The cathode of photodiode PD is coupled to an input node IN of readout circuit 202. The photodiode PD can also be represented by its non-linear model comprising the non-linear and temperature dependent resistor $R_{PD}$ arranged in parallel with the capacitor $C_{PD}$.

Readout circuit 202 comprises an integrator circuit 203, and a preset circuit formed of two portions 204 and 205.

Integrator circuit 203 comprises an operational amplifier OA2, a variable-capacitance capacitor $C_{INT2}$, and two circuits 206 (INMUX) and 207 (OUTMUX) of compensation of an offset voltage $V_{OS2}$ of the operational amplifier.

Capacitor $C_{INT2}$ has an electrode coupled, preferably connected, to input node IN, and an electrode coupled, preferably connected, to output node OUT.

Circuits 206 and 207 are arranged on either side of operational amplifier OA2. More particularly, each circuit 206, 207 comprises two inputs and two outputs. Circuit 206 is the input compensation circuit of operational amplifier OA2.

Circuit 206 has a first input coupled, preferably connected, to the input node IN of readout circuit 202 and a second input is coupled, preferably connected, to reference node GND. A first output is coupled, preferably connected, to a non-inverting input (+) of operational amplifier OA2 and a second output is coupled, preferably connected, to an inverting input (−) of operational amplifier OA2.

Similarly, circuit 207 is the output compensation circuit of operational amplifier OA2. Circuit 207 has a first input coupled, preferably connected, to an inverting output of operational amplifier OA2 and a second input coupled, preferably connected, to a non-inverting output of operational amplifier OA2. A first output is coupled, preferably connected, to the output node OUT of readout circuit 202 and a second output is coupled, preferably connected, to node GND.

Circuits 206 and 207 are circuits capable of alternate the connection between their respective input with respect to a control signal of which polarity vary periodically. Value of the control signal changes between two consecutive integration phases, but remains constant during each integration period. More particularly, when the control signal is in a first state, for example a positive state, inverting input and non-inverting output are connected to GND, and non-inverting input is connected to node IN, whereas inverting output is connected to node OUT. While, when the control signal is in a second state of opposite polarity to the first state, for example a negative state, non-inverting input and inverting output are connected to GND, and inverting input is connected to node IN, whereas non-inverting output is connected to node OUT.

Circuits 206 and 207 are circuits capable of delivering an oscillating square pulse signal varying between a voltage $V_{OS2}$, corresponding to the offset voltage of the operational amplifier OA2, and its opposite, a voltage $-V_{OS2}$, at a frequency defined by the duration of a complete readout operation of readout circuit 202. These circuits 206 and 207 thus compensates for the offset voltage of operational amplifier OA2. Circuits 206 and 207 comprise each at least a multiplexer.

The preset circuit is adapted to implementing a precharge phase of the readout operation. For this purpose, and as previously mentioned, the preset circuit is formed of two portions 204 and 205. Portion 204 is adapted to receiving preset voltage $V_{PRESET}$ multiplied by a coefficient K. Thus, portion 204 comprises two inputs and one output, an input of receiving the voltage and another input being coupled, preferably connected, to node GND. The output of portion 204 is coupled, preferably connected, to the input node IN of the readout circuit. Portion 205 comprises an input coupled, preferably connected, to input node IN and an output coupled, preferably connected, to output node OUT. The value of voltage $V_{PRESET}$ is capable of setting accurately the charge of capacitive element $C_{INT2}$, and thus preset voltage TIA_OUT before the integration phase.

Figure 4:
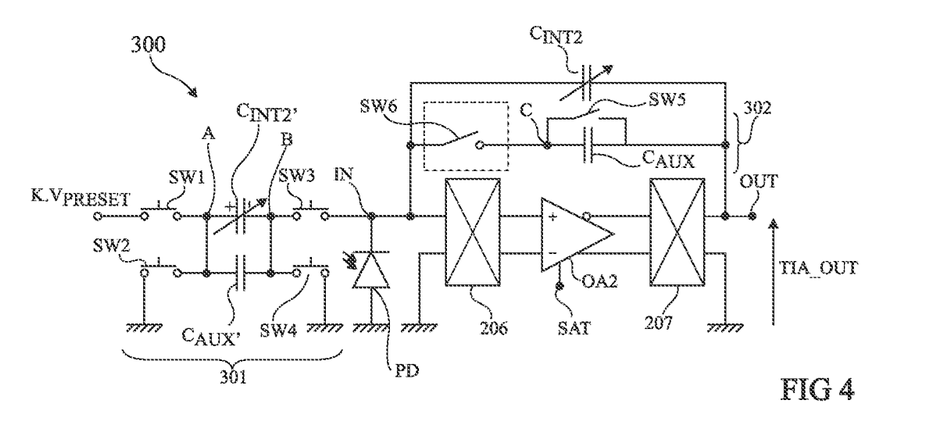
FIG. 4 partially and schematically shows in the form of blocks a more detailed embodiment of the ambient light measurement device of FIG. 3.
Figure 5:
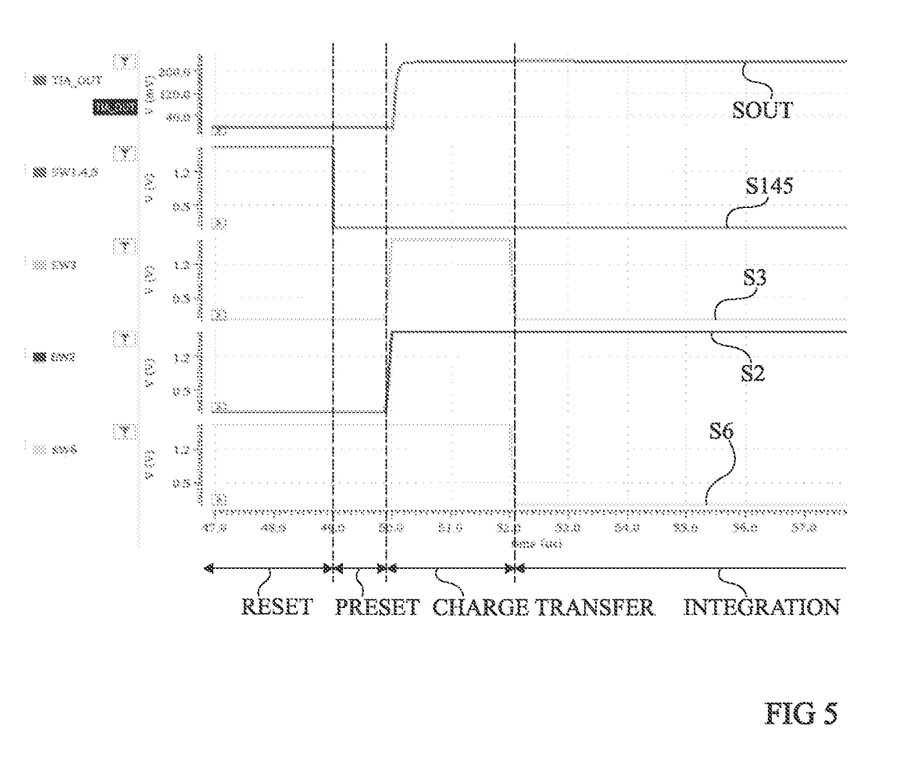
FIG. 5 shows timing diagrams illustrating the operation of the device of FIG. 3.
Figure 8:
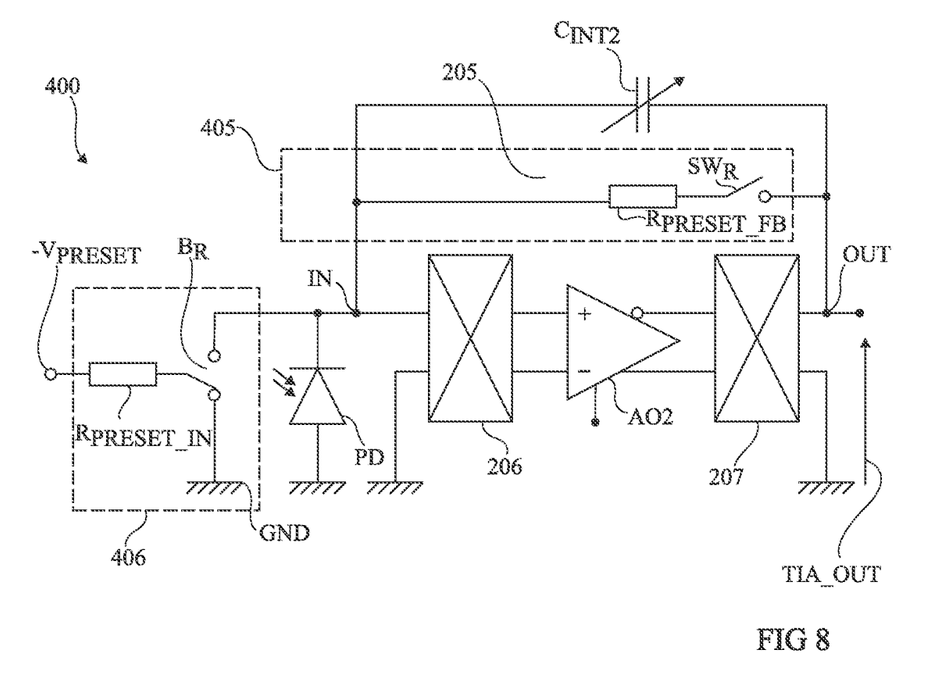
FIG. 8 schematically and partially shows in the form of blocks another more detailed embodiment of the ambient light measurement device of FIG. 3.

Portions 204 and 205 may be formed with capacitors and switches or with resistors and switches. FIGS. 3 to 5 show the embodiment where portions 204 and 205 are formed with capacitors and switches, while FIG. 8 shows the embodiment where portions 204 and 205 are formed with resistors and switches. These two embodiments have similar operating modes, however comprising specificities explained in relation with their respective figures.

FIG. 4 is an electric diagram of a device 300 of the type of the device 200 described in relation with FIG. 3, where the preset circuit is formed of capacitors and of switches.

Devices 200 and 300 have common elements which are not described again herein.

In device 300, the preset circuit comprises a portion 301 similar to the portion 204 described in relation with FIG. 3, and a portion 302 similar to the portion 205 described in relation with FIG. 3.

Portion 301 comprises a power supply node receiving preset voltage $V_{PRESET}$ multiplied by coefficient K, noted $K.V_{PRESET}$, still referenced to the reference voltage of node GND. In the embodiment described herein, coefficient K is greater than zero.

Portion 301 comprises two capacitors $C'_{INT2}$ and $C'_{AUX}$ arranged in parallel with each other. More particularly, capacitor $C'_{INT2}$ is a variable-capacitance capacitor having an electrode coupled, preferably connected, to a node A, and having its other electrode coupled, preferably connected, to a node B. Capacitor $C'_{AUX}$ comprises an electrode coupled, preferably connected, to node A, and another electrode coupled, preferably connected, to node B. Moreover, capacitance of capacitor $C'_{AUX}$, respectively $C'_{INT2}$, is equal to capacitances of capacitance of capacitor $C_{AUX}$, respectively $C_{INT2}$, divided by coefficient K.

Portion 301 further comprises four switches SW1, SW2, SW3, and SW4. Switches SW1 to SW4 are for example transistors. Switch SW1 couples, preferably connects, node A and the node receiving preset voltage $K.V_{PRESET}$. Switch SW2 couples, preferably connects, node A and node GND. Switch SW3 couples, preferably connects, node B and input node IN. Switch SW4 couples, preferably connects, node B and node GND.

Portion 302 comprises a capacitor $C_{AUX}$, and two switches SW5 and SW6. A first electrode of capacitor $C_{AUX}$ is coupled, preferably connected, to a node C, and a second electrode of capacitor $C_{AUX}$ is coupled, preferably connected, to output node OUT. Switch SW5 is arranged in parallel with capacitor $C_{AUX}$. Thus, a first terminal of switch SW5 is coupled, preferably connected, to node C, and a second terminal of switch SW5 is coupled, preferably connected, to output node OUT. Switch SW6 couples, preferably connects, nodes IN and C.

According to an embodiment, capacitor $C'_{INT2}$ has a capacitance equal to the capacitance of capacitor $C_{INT2}$ divided by coefficient K. Similarly, capacitor $C'_{AUX}$ has a capacitance equal to the capacitance of capacitor $C_{AUX}$ divided by coefficient K. Thus, the quantity of energy stored in capacitors $C'_{INT2}$ and $C'_{AUX}$ with voltage $K.V_{PRESET}$ is equal to the quantity of energy that can be stored in capacitors $C_{INT2}$ and $C_{AUX}$, after the preset phase. The otherwise, capacitors $C_{INT2}$ and $C_{AUX}$ are preset to the voltage $V_{PRESET}$ after the end of the preset phase which corresponds to the end of the phase of energy transfer from capacitors $C'_{INT2}$ and $C'_{AUX}$ into capacitors $C_{INT2}$ and $C_{AUX}$.

Capacitors $C'_{AUX}$ and $C_{AUX}$ are important in case of very small capacitor $C_{INT}$, where the charge transfer from capacitor $C'_{INT2}$ towards capacitor $C_{INT2}$ can be corrupted by parasitic injection of the charge by semiconductor switches. In this case, value of capacitor $C_{AUX}$ is considerably large with respect to the one of capacitor $C_{INT}$, for example in the order of 1 pF.

Switches SW1 to SW6 are controlled by different signals which define the operating phases of device 300. Timing diagrams of these signals are described in relation with FIGS. 4 and 5.

Further, in device 300, operational amplifier OA2 operates in a saturation mode. This means, that the output voltage of the operational amplifier AO2 is forced to be very close to the reference voltage GND before the transfer of charge between capacitors. In the meantime, switches SW5 and SW6 are closed, and thus conductive, ensuring that capacitors $C_{INT2}$ and $C_{AUX}$ are discharged. This allows to establish accurately the initial conditions before beginning of the preset phase.

To be in such an operating mode, a small saturation current $I_{SAT}$ is supplied to operational amplifier OA2 on one of its internal power supply terminals SAT. This is described in further detail in relation with FIG. 7.

Figure 6:
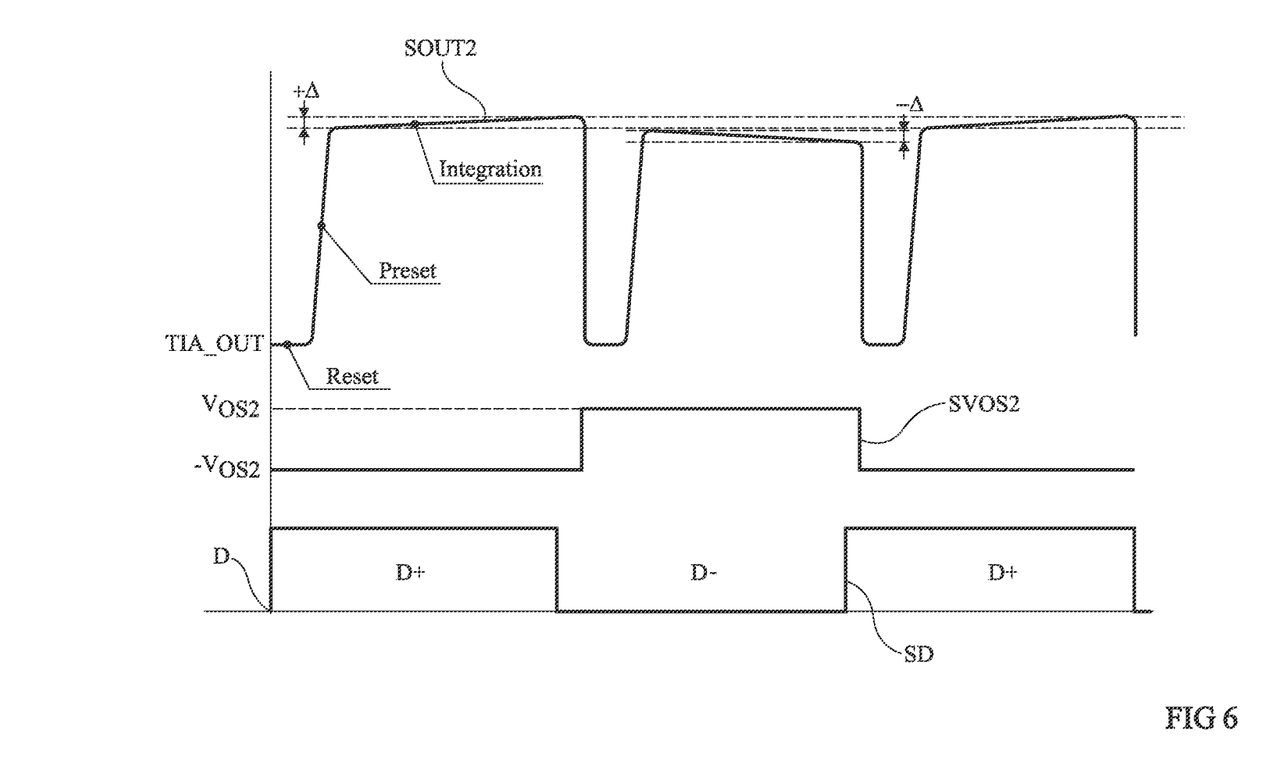
FIG. 6 shows timing diagrams illustrating a plurality of operations of the device of FIG. 3.

FIG. 5 comprises five timing diagrams illustrating the variation of the signals for controlling the switches SW1 to SW6 described in relation with FIG. 4, and output voltage TIA_OUT. FIG. 6 comprises three timing diagrams illustrating the output voltage TIA_OUT during multiples operation shown in FIG. 5. These operations are summarized in Table 1.

TABLE 1

| Axis Label | Curve | Illustrates |
| --- | --- | --- |
| TIA_OUT | SOUT | the time variation of the output voltage TIA_OUT delivered by device 300 |
| SW 1, 4, 5 | S145 | the time variation of a control signal common to switches SW1, SW4, and SW5 |
| SW3 | S3 | the time variation of a signal for controlling switch SW3 |
| SW2 | S2 | the time variation of a signal for controlling switch SW2 |
| SW6 | S6 | the time variation of a signal for controlling switch SW6 |

The operations of FIG. 6 are summarized in Table 2.

TABLE 2

| Axis Label | Curve | Illustrates |
| --- | --- | --- |
| TIA_OUT | SOUT2 | the time variation of the output voltage TIA_OUT delivered by device 300 |
| +/−VOS2 | SVOS2 | the signal furnished by circuits 206 and 207 |
| D | SD | the driving signal D of circuits 206 and 207 |

The curves of FIG. 5 more particularly illustrate the operation of device 300 during its operating phases. Indeed, the operation of device 300 comprises a reset phase (RESET) during which capacitor $C_{INT2}$ is discharged, a precharge phase (PRESET) during which capacitor $C_{INT2}$ is being charged, a charge transfer phase (CHARGE TRANSFER) during which charge from the photodiode PD is transferred to the readout circuit, and an integration phase (INTEGRATION) during which capacitor $C_{INT2}$ is charged.

More particularly, during the reset phase, capacitor $C_{INT2}$ is discharged, and output signal TIA_OUT is at a low reference value, also called saturation low level. Circuits 206 and 207 are configured to one polarity by the driving signal D. The polarity of the driving signal remains unchanged until the end of the integration phase.

Switches SW1, SW4, and SW5 are conductive and their control signal, having its variation illustrated by curve S145, is at a high reference value, also called high level. Switch SW2 is not conductive, and its control signal, having its variation illustrated by curve S2, is at a low level. Switch SW3 is not conductive, and its control signal, having its variation illustrated by curve S3, is at a low level. Switch SW6 is conductive, and its control signal, having its variation illustrated by curve S6, is at a high level.

In this configuration, capacitors $C'_{INT2}$ and $C'_{AUX}$ receive preset voltage $K.V_{PRESET}$ on their first electrodes, via node A, and the reference voltage of node GND on their second electrodes, via node B. Thus, capacitors $C'_{INT2}$ and $C'_{AUX}$ charge. More particularly, capacitors C'$_{INT2}$ and C'$_{AUX}$ store an energy equal to the energy that capacitors C$_{INT2}$ and C$_{AUX}$ can store.

Further, switches SW5 and SW6 short-circuit capacitors C$_{INT2}$ and C$_{AUX}$, and the input terminal of circuit 206 is at a saturation voltage of the operational amplifier OA2, meaning at a voltage closed to the reference voltage, that is the ground.

During the precharge phase, capacitors C$_{INT2}$ and C$_{AUX}$ are charged by using the energy stored in capacitors C'$_{INT2}$ and C'$_{AUX}$. Due to the saturation voltage injected by circuit 206 to input of the operational amplifier OA2, output voltage TIA_OUT remains at the low level.

For this purpose, switches SW1, SW4, and SW5 are made non-conductive. Thus, capacitors C'$_{INT2}$ and C'$_{AUX}$ receive the reference voltage of node GND on their first electrodes, via node A, and have their second electrodes coupled, preferably connected, to input node IN, via node B. Capacitor C$_{AUX}$ is no longer short-circuited by switch SW5. The energy stored by capacitors C'$_{INT2}$ and C'$_{AUX}$ are then transferred to capacitors C$_{INT2}$ and C$_{AUX}$.

During the charge transfer phase, the current delivered by the ambient light sensor, that is, photodiode PD, is transferred to the operational amplifier OA2. The current delivered by the photodiode PD can be called photocurrent. However, due to large value of capacitor C$_{AUX}$, it has less impact to the voltage V$_{PRESET}$.

For this purpose, switches SW2, SW3, and SW6 are conductive.

During the integration phase, the integrator circuit can integrate the current delivered by the photodiode PD.

For this purpose, switches SW3 and SW6 are rendered non-conductive. The addition of capacitor C$_{AUX}$ enables to decrease a voltage peak likely to appear at the beginning of the integration phase due to the turning on of switch SW3 and to the value of the capacitance of capacitor C$_{INT2}$. In other words, capacitor C$_{AUX}$ allows to protect capacitors C$_{INT2}$ and C'$_{INT2}$ which have a value of capacity inferior to the one of capacitor C$_{AUX}$. Capacitor C$_{AUX}$ has, for example, a capacitance in the range from 1 to 10 pF. Capacitor C$_{AUX}$ allows thus to absorb the excess charge (charge injection) that capacitor C$_{INT}$ and C'$_{INT2}$ are not able to absorb.

The advantage of the embodiment described with FIGS. 3 and 4 is that, after the reset phase, the charge of capacitors C'$_{INT2}$ and C'$_{AUX}$ are transferred to capacitors C$_{INT2}$ and C$_{AUX}$. This transfer is mediated by the feedback of the operational amplifier OA2, which maintains a virtual zero added to the offset voltage V$_{OS2}$ at the input of the circuit 206. However, an offset voltage applied to the photodiode creates one polarity of error current i$_{error}$ via the resistance R$_{PD}$ of the photodiode PD, which is integrated together with the current delivered by the photodiode PD. As result, at the end of integration, TIA_OUT voltage contains a useful compound related to the current delivered by the photodiode PD, and an error compound due to the one polarity of i$_{error}$ error current.

For the next integration, as shown in a FIG. 6 which illustrate a series of three successive operations described in FIG. 5, the polarity of the driving signal, referenced D, of circuits 206 and 207 is reversed, from a value D+ to a value D−. Thus, after a second reset phase, the input voltage of the circuit 206 and 207 is equal to the opposite of voltage V$_{OS2}$, referenced −V$_{OS2}$. Thus, after the preset phase, integrator integrate the current delivered by the photodiode PD with an error current corresponding to the opposite of error current i$_{error}$, referenced −i$_{error}$. As a result, at the end of integration phase, TIA_OUT voltage contains useful compound dependent of the current delivered by the photodiode PD, and an error compound dependent of the opposite of the error current i$_{error}$ with respect to previous integration cycle. As result, the average value of two consecutive integrations removes the offset error due to the resistance of the photodiode PD.

As already mentioned, the error compound is important namely at high temperatures. Moreover, the accurate cancellation of error current i$_{error}$ rely on a good linearity of the photodiode PD depending of the I-V characteristic of voltages V$_{OS2}$ and −V$_{OS2}$. The otherwise error current i$_{error}$ being as close as possible to error current −i$_{error}$ is required.

Figure 7:
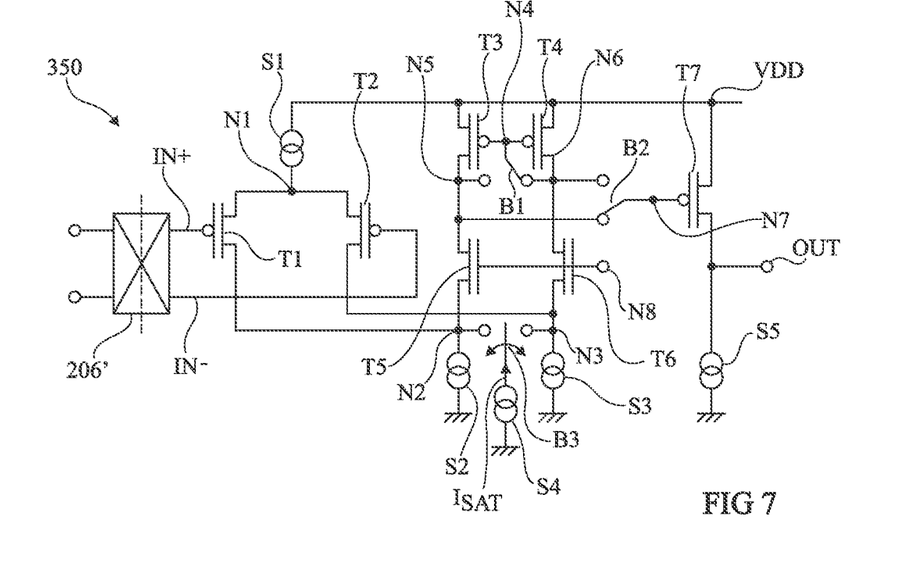
FIG. 7 shows in more detailed fashion a portion of the device of FIG. 3.

FIG. 7 is a more detailed electric diagram of an operational amplifier 350 of the type of operational amplifier OA2. FIG. 7 illustrates the operation of amplifier 350 that can be set to a saturation mode.

Like the operational amplifier OA2 described in relation with FIG. 4, operational amplifier 350 has its inverting and non-inverting input terminals IN− and IN+ coupled, preferably connected, to output terminals of a circuit 206' of the type of offset voltage compensation circuit 206.

Operational amplifier 350 comprises two PMOS-type transistors T1 and T2, that is, transistors of P-channel metal-oxide semiconductor field-effect type, or MOSFET-type transistors. The gate of transistor T1 is coupled, preferably connected, to the non-inverting input IN+ of operational amplifier 350. A first conduction terminal of transistor T1 is coupled, preferably connected, to a node N1, and a second conduction terminal T1 is coupled, preferably connected, to a node N2. The gate of transistor T2 is coupled, preferably connected, to the inverting input IN− of operational amplifier 350. A first conduction terminal of transistor T2 is coupled, preferably connected, to a node N1, and a second conduction terminal T2 is coupled, preferably connected, to a node N3.

Operational amplifier 350 further comprises a current source S1 having a first terminal coupled, preferably connected, to node N1, and a second one coupled, preferably connected, to a node VDD receiving a power supply voltage of operational amplifier 350.

Operational amplifier 350 further comprises two PMOS-type transistors T3 and T4. The gate of transistor T3 is coupled, preferably connected, to a node N4. A first conduction terminal of transistor T3 is coupled, preferably connected, to node VDD, and a second conduction terminal T3 is coupled, preferably connected, to a node N5. The gate of transistor T4 is coupled, preferably connected, to node N4. A first conduction terminal of transistor T4 is coupled, preferably connected, to node VDD, and a second conduction terminal T4 is coupled, preferably connected, to a node N6.

Operational amplifier 350 further comprises a switch B1 having its input coupled, preferably connected, to node N4. The output of switch B1 oscillates between nodes N5 and N6. The switch enables to control the phase of operational amplifier 350 with respect to the driving voltage described in relation with FIGS. 5 and 6.

Operational amplifier 350 further comprises a switch B2 having an input coupled, preferably connected, to a node N7. The output of switch B2 oscillates between nodes N5 and N6. Switches B1 and B2 form the output of the operational amplifier 350 which is coupled to the circuit 207.

Operational amplifier 350 further comprises two cascode NMOS-type transistors T5 and T6. The gate of transistor T5 is coupled, preferably connected, to a node N8. A first conduction terminal of transistor T5 is coupled, preferably connected, to node N5, and a second conduction terminal T5 is coupled, preferably connected, to a node N2. The gate of transistor T6 is coupled, preferably connected, to node N8. A first conduction terminal of transistor T6 is coupled, preferably connected, to node N6, and a second conduction terminal T6 is coupled, preferably connected, to node N3. Node N8 for example receives a bias voltage.

Operational amplifier 350 further comprises an output PMOS-type transistor T7. The gate of transistor T7 is coupled, preferably connected, to node N7. A first conduction terminal of transistor T7 is coupled, preferably connected, to node VDD, and a second conduction terminal T5 is coupled, preferably connected, to a non-inverting output OUT of operational amplifier 350.

Operational amplifier 350 further comprises two constant current sources S2 and S3. A first terminal of source S2 is coupled, preferably connected, to node N2, and a second one coupled, preferably connected, to a node receiving a reference voltage of operation amplifier 350. A first terminal of source S3 is coupled, preferably connected, to node N3, and a second one coupled, preferably connected, to a node receiving a reference voltage of operational amplifier 350.

Operational amplifier 350 further comprises a current source S4 that allows to force the output voltage of the operational amplifier 350 to be in a negative saturation during the reset phase. A first terminal of source S4 is coupled, preferably connected, to output OUT, and a second one coupled, preferably connected, to a node receiving the reference voltage of operational amplifier 350.

To be set to a saturation mode, operational amplifier 350 further comprises a switch B3 and a current source S5. An input of the switch is coupled, preferably connected, to a first terminal of current source S5. The output of switch B2 oscillates between nodes N2 and N3. The second terminal of current source S5 is coupled, preferably connected, to the node receiving the reference voltage of operational amplifier 350. To be set to the saturation mode, current source S5 supplies saturation current $I_{SAT}$ that misbalance the operational amplifier 350 and set its output to saturation during the phase of reset of the device 200 described in relation with FIG. 3.

FIG. 8 is an electric diagram of a device 400 of the type of the device 200 described in relation with FIG. 3, where a preset circuit is formed of resistors and of switches.

Like the device 200 described in relation with FIG. 3, device 400 comprises a preset circuit formed of two portions 405 and 406.

Portion 405 is similar to the portion 205 described in relation with FIG. 3. Thus, portion 405 is arranged between input and output nodes IN and OUT.

Portion 405 comprises a resistor $R_{PRESET\_FB}$ and a switch $SW_R$ arranged in series. A first terminal of resistor $R_{PRESET\_FB}$ is coupled, preferably connected, to input node IN, and a second terminal of resistor $R_{PRESET\_FB}$ is coupled, preferably connected, to the first terminal of switch $SW_R$. The second terminal of switch $SW_R$ is coupled, preferably connected, to output node OUT.

Portion 406 is similar to the portion 206 described in relation with FIG. 3. Thus, portion 406 receives preset voltage $V_{PRESET}$ multiplied by coefficient K which is, in this embodiment, equal to −1, the voltage is then noted $-V_{PRESET}$, referenced to a reference voltage. Thus, in this embodiment, the preset voltage $V_{PRESET}$ is a negative voltage. Further, portion 406 is coupled, preferably connected, to input node IN.

Portion 406 comprises a resistor $R_{PRESET\_IN}$ and a flip-flop $B_R$. A terminal of resistor $R_{PRESET\_IN}$ is coupled, preferably connected, to the node receiving voltage $-V_{PRESET}$, and a second terminal of resistor $R_{PRESET\_IN}$ is coupled, preferably connected, to the input terminal of flip-flop $B_R$. The output of flip-flop $B_R$ oscillates between nodes GND and IN.

The operation of device 400 comprises the two following phases. A precharge phase during which capacitor $C_{INT2}$ is charged, and an integration phase where capacitor $C_{INT2}$ is used.

During the precharge phase, switch $SW_R$ is conductive and the assembly formed with operational amplifier OA2 is an inverter amplifier assembly and not an integrator assembly. Switch $B_R$ couples resistor $R_{PRESERT\_IN}$ to input IN and capacitor $C_{INT2}$ charges.

During the integration phase, switch $SW_R$ is non-conductive and the assembly formed with operational amplifier OA2 is effectively an integrator assembly. Switch $B_R$ couples resistor $R_{PRESERT\_IN}$ to node GND.

The embodiment described in relation with FIG. 4 has the advantage of operating with no addition of an outer circuit, conversely to the embodiment described in relation with FIG. 8 which may require a charge pump type negative voltage generator to deliver voltage $-V_{PRESET}$.

The embodiment of FIG. 8 has the advantage of comprising fewer components than the embodiment of FIG. 8 and of not requiring a reset phase.

Various embodiments and variants have been described. Those skilled in the art will understand that certain features of these various embodiments and variants may be combined, and other variants will occur to those skilled in the art.

Finally, the practical implementation of the described embodiments and variations is within the abilities of those skilled in the art based on the functional indications given hereinabove.

What is claimed is:

1. A circuit comprising:
    an operational amplifier;
    a first capacitor having a first electrode coupled to an inverting input of the operational amplifier and a second electrode coupled to a non-inverting output of the operational amplifier;
    a compensation circuit coupled between the operational amplifier and the first capacitor; and
    a preset circuit comprising:
        an input coupled to a first voltage node;
        an output coupled to the first capacitor, the first voltage node configured to carry a first voltage equal to a preset voltage multiplied by a coefficient;
        a second capacitor having a capacitance equal to a capacitance of the first capacitor divided by the coefficient;
        a third capacitor having a capacitance smaller than the capacitance of the first capacitor; and
        a fourth capacitor having a capacitance equal to the capacitance of the third capacitor divided by the coefficient.

2. The circuit according to claim 1, wherein the compensation circuit comprises an input circuit coupled to the inverting input and to a non-inverting input of the operational amplifier and an output circuit coupled to an inverting output and the non-inverting output of the operational amplifier.

3. The circuit according to claim 2, wherein the compensation circuit is designed to compensate for an offset voltage of the operational amplifier.

4. The circuit according to claim 3, wherein the compensation circuit is designed to deliver a square pulse signal having an amplitude equal to the amplitude of the offset voltage of the operational amplifier.

5. The circuit according to claim 1, wherein the second and fourth capacitors are coupled in parallel.

6. The circuit according to claim 5, wherein a third electrode of the second capacitor is coupled to the first voltage node by a first switch and is coupled to a reference potential node by a second switch; and wherein a fourth electrode of the second capacitor is coupled to the inverting input of the operational amplifier by a third switch and is coupled to the reference potential node by a fourth switch.

7. The circuit according to claim 1, wherein the third capacitor is short-circuited by a fifth switch and is coupled to the inverting input of the operational amplifier by a sixth switch.

8. The circuit according to claim 1, wherein the coefficient is greater than zero.

9. The circuit according to claim 1, wherein the operational amplifier is designed to operate in a saturation mode.

10. The circuit according to claim 1, further comprising a flip-flop, wherein the preset circuit comprises a first resistor having a first terminal coupled to the first voltage node and a second terminal coupled to an input of the flip-flop that is designed to oscillate between a reference potential node and a non-inverting input of the operational amplifier, and wherein the preset circuit further comprises a second resistor having a third terminal coupled to the non-inverting input of the operational amplifier and a fourth terminal coupled to the non-inverting output of the operational amplifier via a seventh switch.

11. The circuit according to claim 10, wherein the coefficient is equal to −1.

12. The circuit according to claim 1, further comprising an ambient light sensor coupled to the first electrode of the first capacitor.

13. The circuit according to claim 12, wherein the ambient light sensor comprises a photodiode.

14. A circuit comprising:
an operational amplifier;
a first capacitor having a first electrode coupled to an inverting input of the operational amplifier and a second electrode coupled to a non-inverting output of the operational amplifier;
a compensation circuit coupled between the operational amplifier and the first capacitor;
a second capacitor having a capacitance equal to a capacitance of the first capacitor divided by a coefficient;
a third capacitor having a capacitance smaller than the capacitance of the first capacitor;
a fourth capacitor having a capacitance equal to the capacitance of the third capacitor divided by the coefficient, the fourth capacitor having a first electrode coupled to a first electrode of the second capacitor and also having a second electrode coupled to a second electrode of the second capacitor;
a first switch coupled between the first electrode of the second capacitor and a first voltage node, the first voltage node configured to carry a first voltage equal to a preset voltage multiplied by the coefficient;
a second switch coupled between the first electrode of the fourth capacitor and a reference potential node;
a third switch coupled between the second electrode of the second capacitor and the first electrode of the first capacitor;
a fourth switch coupled between the second electrode of the fourth capacitor and the reference potential node;
a fifth switch coupled between a second electrode of the third capacitor and the second electrode of the first capacitor; and
a sixth switch coupled between a first electrode of the third capacitor and the first electrode of the first capacitor.

15. The circuit according to claim 14, wherein the compensation circuit comprises an input circuit coupled to the inverting input and to a non-inverting input of the operational amplifier and an output circuit coupled to an inverting output and the non-inverting output of the operational amplifier.

16. The circuit according to claim 15, wherein the compensation circuit is designed to compensate for an offset voltage of the operational amplifier.

17. The circuit according to claim 16, wherein the compensation circuit is designed to deliver a square pulse signal having an amplitude equal to the amplitude of the offset voltage of the operational amplifier.

18. A method for operating the circuit according to claim 14, the method comprising:
precharging the first capacitor;
performing an integration phase where a voltage level is obtained at the first capacitor; and
discharging the first capacitor after the integration phase is complete.

19. A circuit comprising:
an operational amplifier;
a first capacitor having a first electrode coupled to an inverting input of the operational amplifier and a second electrode coupled to a non-inverting output of the operational amplifier;
a compensation circuit coupled between the operational amplifier and the first capacitor; and
a preset circuit comprising:
an input coupled to a first voltage node;
an output coupled to the first capacitor, the first voltage node configured to carry a first voltage equal to a preset voltage multiplied by a coefficient; and
a second capacitor having a capacitance equal to a capacitance of the first capacitor divided by the coefficient; and
a flip-flop,
wherein the preset circuit comprises a first resistor having a first terminal coupled to the first voltage node and a second terminal coupled to an input of the flip-flop that is designed to oscillate between a reference potential node and a non-inverting input of the operational amplifier, and
wherein the preset circuit further comprises a second resistor having a third terminal coupled to the non-inverting input of the operational amplifier and a fourth terminal coupled to the non-inverting output of the operational amplifier via a seventh switch.

* * * * *